United States Patent [19]

Ahmed

[11] 3,878,471

[45] Apr. 15, 1975

[54] STABILIZATION OF QUIESCENT COLLECTOR POTENTIAL OF CURRENT-MODE BIASED TRANSISTORS

[75] Inventor: Adel Abdel Aziz Ahmed, Annandale, N.J.

[73] Assignee: RCA Corporation, New York, N.Y.

[22] Filed: Apr. 5, 1974

[21] Appl. No.: 458,186

Related U.S. Application Data

[63] Continuation of Ser. No. 302,866, Nov. 1, 1972, abandoned.

[52] U.S. Cl. ................ 330/40; 307/297; 330/30 D; 330/38 M

[51] Int. Cl. ............................................ H03f 3/04

[58] Field of Search........... 330/22, 23, 38 M, 30 D, 330/40; 307/297

[56] References Cited

UNITED STATES PATENTS

| | | | |
|---|---|---|---|
| 3,532,909 | 10/1970 | Buckley | 330/40 X |
| 3,551,832 | 12/1970 | Graeme | 330/30 D |
| 3,686,580 | 8/1972 | Van den Plassche | 330/22 X |
| 3,689,752 | 9/1972 | Gilbert | 307/229 |
| 3,701,032 | 10/1972 | Steckler | 330/38 M |
| 3,717,821 | 2/1973 | Amemiya et al. | 330/26 |

*Primary Examiner*—James B. Mullins
*Attorney, Agent, or Firm*—H. Christoffersen; S. Cohen; A. L. Limberg

[57] ABSTRACT

Current-mode biasing of the base electrode of a collector-loaded amplifier transistor is accomplished without suffering quiescent collector potential variations caused by variations in its common-emitter forward current gain ($h_{fe}$). To do this, collector and base currents in the ratio of $f_{fe}$ to 1 are impressed upon the transistor from a current supply, wherein the ratio is determined. The quiescent collector potential of the transistor is then determined by the connections of the collector load and is independent of the collector current of the transistor and its attendant variations due to $h_{fe}$ changes.

13 Claims, 4 Drawing Figures

STABILIZATION OF QUIESCENT COLLECTOR POTENTIAL OF CURRENT-MODE BIASED TRANSISTORS

This is a continuation of application Ser. No. 302,866 filed Nov. 1, 1972 and now abandoned.

The present invention relates to biasing a current-amplifier transistor and more particularly to bias circuitry for a collector-loaded transistor which stabilizes its quiescent collector voltage against variations of its common-emitter forward current gain ($h_{fe}$) despite its base electrode being current-mode biased.

Applying externally determined quiescent base current to a transistor, current-mode base biasing, has the feature that the current source applying base current to the transistor can have an impedance high enough not to appreciably reduce the input impedance of the amplifier for signal. Current mode base biasing is disfavored because small variations in forward current gain $h_{fe}$ of the amplifier transistor (from unit to unit or with temperature variation) cause unacceptably large variations of quiescent collector potential in collector-loaded transistor amplifiers.

Voltage-mode biasing, where a stabilized voltage is impressed between the base and emitter electrodes of the transistor, is presently the favored method of biasing transistors. This stabilized voltage may be developed by means external to the transistor (e.g., a voltage as developed across a forward-biased semiconductor junction). This stabilized voltage may also be developed by the transistor itself by arranging for its emitter current to be regulated either directly (e.g., a current supply in the emitter) or indirectly by a feedback loop including the transistor (e.g., by an emitter degeneration resistance and a suitably low-impedance base bias network).

The present invention is embodied in a biasing arrangement for a first transistor which has a source of reference and operating potentials and has a current supply to provide first and second currents. Means included within the current supply is responsive to the absolute temperature of the first transistor to maintain the amplitudes of the first and second currents in a ratio equal to the forward current gain $h_{fe}$ of the first transistor. The biasing arrangement further comprises means to impress said first and said second currents upon the collector and base electrodes of the first transistor respectively and means to couple the emitter electrode of the first transistor to the reference potential. Collector load means are coupled to the first transistor collector electrode and provide a direct current path to the operating potential.

A preferred embodiment of the present invention uses a second transistor which is arranged to experience similar temperature variations to those experienced by the first transistor. The base and collector currents of the second transistor are measured to determine suitable base and collector currents to be impressed upon the first transistor. Biasing means condition the second transistor for collector-current-to-base-current gain capability and may constitute voltage-mode base biasing means. A means responsive to the second transistor base current to provide a first current proportional thereto supplies said first current to the first transistor base electrode. A means responsive to the second transistor collector current to provide a second current proportional thereto supplied said second current to the first transistor collector electrode.

The present invention will be better understood by reference to the drawing and the ensuing description thereof in which.

Figure 1:
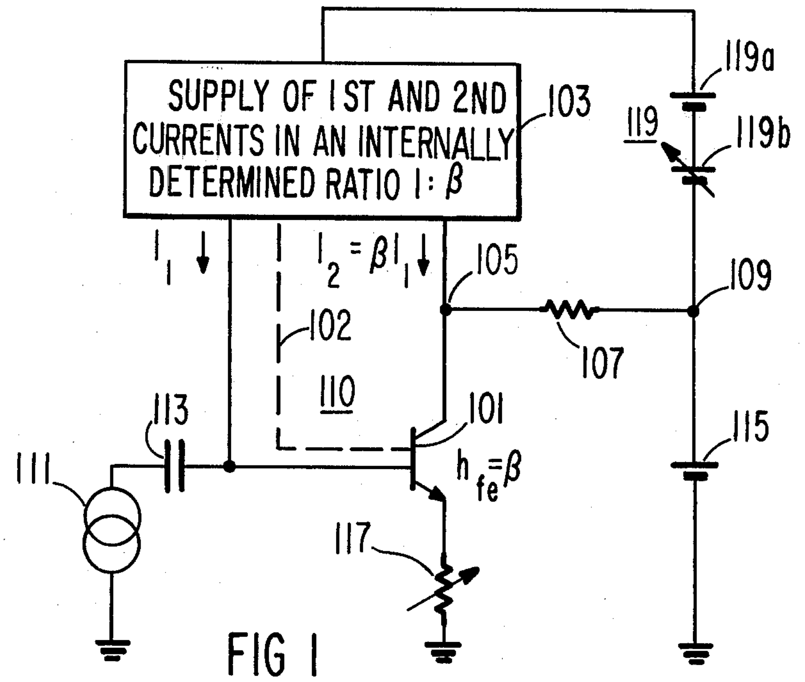
FIG. 1 illustrates in partial schematic form theh basic concept of the present invention.

Referring to FIG. 1 a transistor 101 has a quiescent base current $I_1$, supplied to its base electrode from a current supply 103. The supply 103 supplies a second current $I_2$ to a circuit node 105 at the collector electrode of transistor 101. The current $I_2$ is $\beta$ times as large as current $I_1$, as determined within the supply 103. Responsive to the temperature of transistor 101 as sensed via the thermal coupling 102, supply 103 maintains $\beta$ substantially equal to the common-emitter forward current gain $h_{fe}$ of the transistor 101.

As used within this specification and its attendant cliams the term "current supply" is used in the sense of a source of currents with an internal impedance which is high compared to the elements to which it is connected providing in effect the "current source(s)" or "current sink(s)" or combinations thereof of electronic circuit theory. The magnitude of a supplied current is determined within the supply and not by the loading placed upon the supply within the range of applied loading.

The quiescent base current $I_1$ causes a quiescent collector current in the transistor 101 which is $h_{fe}$ times as large, by conventional transistor action. The quiescent collector current of transistor 101 and $I_2$ are equal in amplitude, one flowing into and the other out of (node) 105. By Kirchoff's Current Law there will be no quiescent current flow through the collector load resistance 107, connected at one of its ends to the node 105. This requires there be no quiescent potential drop across the collector load resistance 107, so node 105 will assume the same quiescent potential as node 109 to which the other end of collector load resistance 107 is connected.

Since the quiescent potential at node 105 is determined by means independent of the transistor 101 so long as $\beta$ is maintained equal to the $h_{fe}$ of transistor 101, similar variations in the parameters $\beta$ and $h_{fe}$ will not affect the quiescent collector potential of transistor 101. The variations in the $h_{fe}$ of transistor 101 are compensated by variations of $\beta$ and therefore do not alter the quiescent collector potential of transistor 101.

The other elements shown in FIG. 1 complete connection of transistor 101 as a common-emitter amplifier stage 110. A source of input signal 111 is coupled to the base electrode of transistor 101 by means of capacitor 113. The base bias current provided from the supply 103 can be supplied at a higher input impedance than that of a conventional resistive potential divider base bias network required to secure stable biasing of the transistor 101.

A potential source 115 connecting node 109 to a reference potential and a direct-coupling element 117 connecting the emitter electrode of transistor 101 to the reference potential complete the collector-to-emitter loop for amplifier signals from transistor 101. The direct coupling element 117 (shown as a rheostat) may be a fixed resistor or a direct connection. The direct coupling element 117 in the emitter circuit of transistor 101 performs its conventional role of determining the gain of the stage 110. However, there is no requirement for the direct-coupling element 117 to permit accurate determination of the quiescent collector potential of the transistor 101 when the present invention is used.

Series connected direct potential sources 119*a* and 119*b* are shown connecting the supply 103 to node 109 to facilitate the closing of the loops wherein currents $I_1$ and $I_2$ flow. Presuming the direct potential provided by the source 119*a* to be sufficiently large to provide correct bias for the supply 103, variations in the direct potential provided by the source 119*b* will have no effect upon the operation of the circuit. The circuit has its operating potentials fixed with respect to the direct potential source 115.

Alternatively, the quiescent collector potential of the transistor 101 may be determined by the input bias network of a succeeding stage direct coupled in cascade thereafter.

While the present invention is shown in FIG. 1 as applied to a common-emitter amplifier stage, it is applicable to any collector-loaded transistor amplifier. A common-base amplifier with high input impedance is facilitated by the present invention, and the direct coupling element 117 may be provided by a high-impedance current source to further facilitate such an amplifier.

Figure 2:
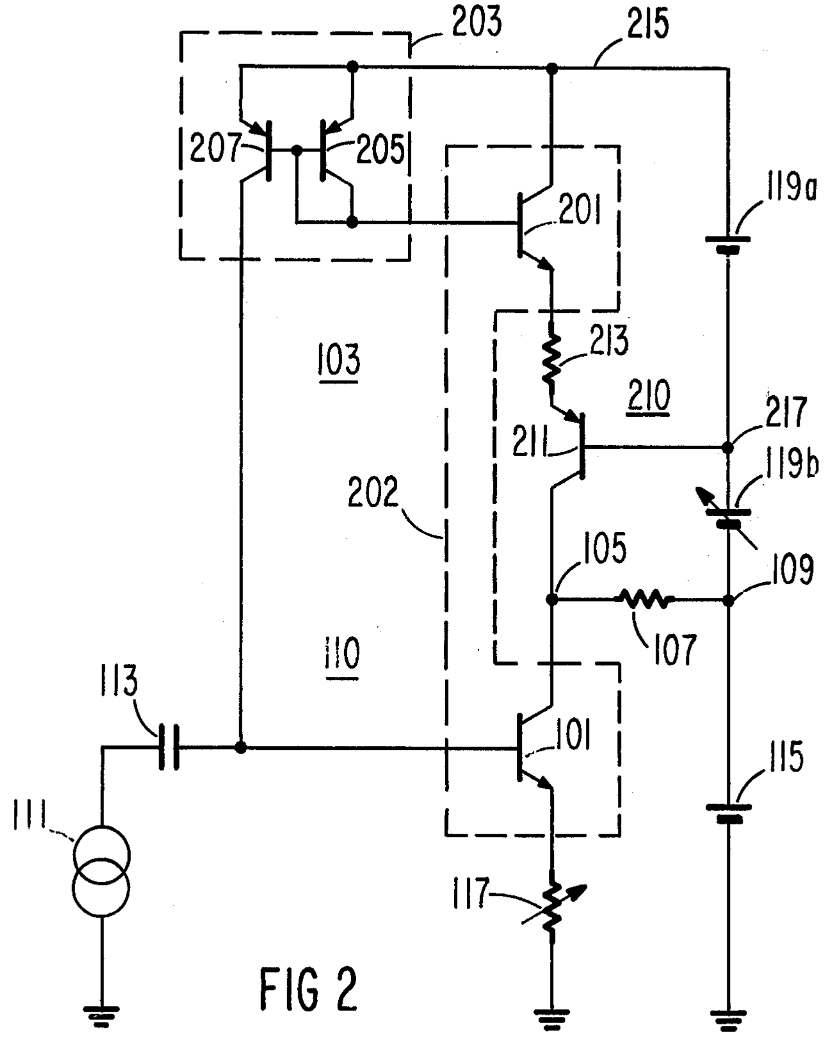
FIG. 2 illustrates an embodiment of the present invention particularly useful when matched transistors of each complementary conduction type are available which have high current gains (>10)

Referring to FIG. 2 a current supply 103 is shown schematically. A transistor 201 identical in structure to transistor 101 and in the same thermal environment 202 will exhibit the same relationship between collector and base currents as transistor 101. Proximate transistors fabricated in the same monolithic integrated circuit can provide such relationship.

A current amplifier 203 provides a quiescent base current to transistor 101 substantially equl to the base current of transistor 201. This current amplifier 203 providing an output current equal in amplitude to its input current provides what is popularly termed a "current mirror". The current mirror circuit 203 typically comprises two transistors identical in structure, proximate to each other in the same monolithic integrated circuit and connected in the manner of transistors 205, 207 in FIG. 2.

Since their base currents are alike and they have the same collector-to-base current relationship, transistors 101 and 201 have like collector currents. The emitter current of transistor 201 which is substantially equal to its collector current is applied to the node 105 via a common-base transistor amplifier 210 including transistor 211 and resistor 213 and having substantially unity current gain. Since the quiescent currents coupled to the node 105 from transistors 101 and 201 are alike in value and opposite in sense of flow with respect to the node 105, there is substantially no quiescent current flow through the collector load resistance 107 of the transistor 101. Therefore, as in the circuit of FIG.

1 the potential at the collector electrode of transistor 101 is substantially the same as that at the node 109.

The quiescent base currents in transistors 101 and 201 are determined in the following manner. The series combination of the diode-connected transistor 205 and the base-emitter junction of transistor 201 provide a 2 $V_{BE}$ potential offset between node 215 and the emitter electrode of transistor 201. ($V_{BE}$ is the quiescent offset potential across a forward-based semiconductor junction and is approximately 650 millivolts for silicon PN junctions.) The emitter electrode of transistor 211 has a 1 $V_{BE}$ potential offset from node 217 as provided by its base-emitter junction. The voltage across the resistor 213 ($V_{213}$) is maintained equal to the voltage applied by the potential supply 119*a* ($V_{119a}$) between nodes 217, 215 minus these 2 $V_{BE}$ and 1 $V_{BE}$ potential offsets. The voltage $V_{213}$ impressed upon the resistor 213 determines the current flow ($I_{213}$) therethrough which current flow provides the emitter currents of transistors 201 and 211. The emitter current of a normally biased transistor such as 201 is the sum of its base and collector currents. Since the ratio relationship ($h_{fe}$) between these base and collector currents is known, they may be easily calculated knowning the emitter current $I_{213}$. The collector current of transistor 201 is $(h_{fe} I_{213})$ $(1 + h_{fe})$, and its base current is $I_{213}/(1 + h_{fe})$. A similar base current flows quiescently in transistor 101 because of the current mirror circuit.

FIG. 2 illustrates an important aspect of the present invention. A transistor which insofar as forward current gain is concerned matches the transistor to be provided current-mode base biasing can be stably biased by voltage-mode base biasing means and then have its base and collector currents used as reference currents to determine the base and collector currents of the current-mode biased transistor.

The effects of the quiescent base currents of transistors 205, 207, 211 have been ignored as negligibly affecting the circuit which is a valid presumption when they have $h_{fe}$'s greater than 20 or so. The effects of the base currents of transistors 205, 207 reduce the current gain of the current mirror circuit 203 from unity, which effect may be avoided if necessary by using more sophisticated current mirror circuits. The quiescent base current of transistor 211 if matched to that of transistor 201 (as will be the case if their $h_{fe}$'s are made equal) will permit the collector currents of transistors 201 and 211 to be equal improving the match between the collector currents of transistors 101 and 211.

The common-base transistor amplifier 210 can be viewed as an element which regulates the current through itself to be constant within the context of the illustrated circuit and known circuits performing an equivalent function may replace it to link the emitter electrode of transistor 201 and the node 105.

Figure 3:
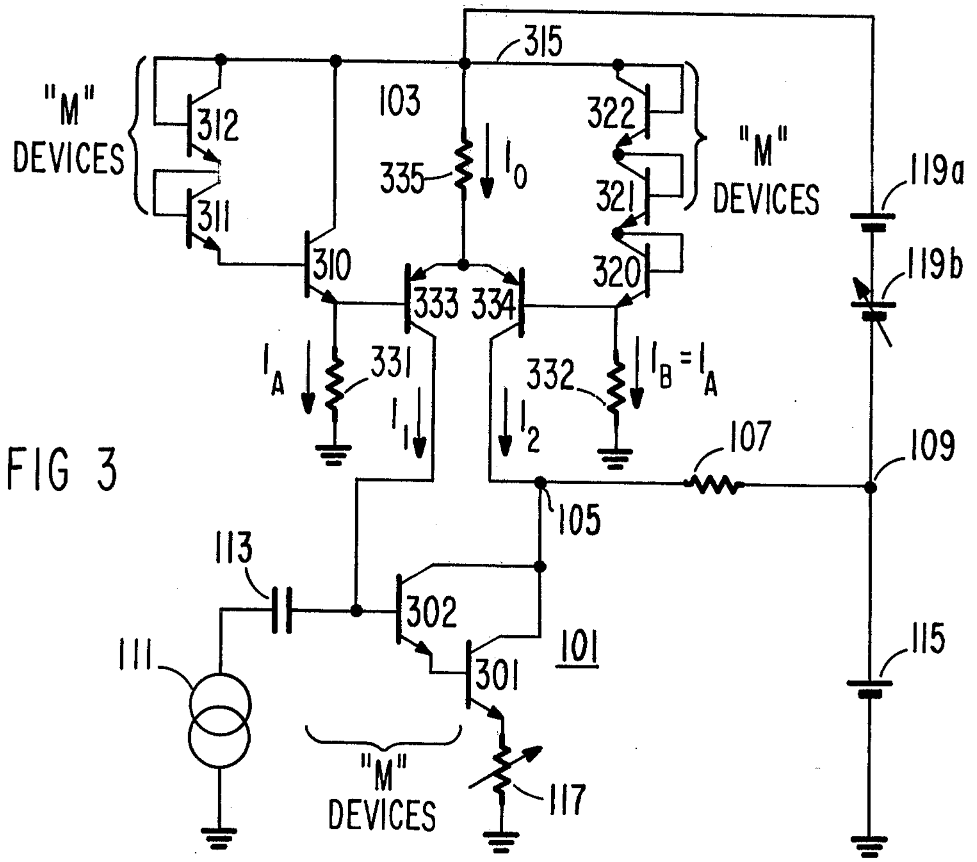
FIG. 3 illustrates an embodiment of the present invention particularly useful when complementary transistor types available have high current gains associated with only one of the types.

FIG. 3 shows an embodiment of the present invention which permits lower $h_{fe}$ complementary conductivity (PNP) transistors to be used than the FIG. 2 configuration. Such embodiments are particularly useful in P substrate monolithic silicon integrated circuitry in which NPN transistors predominate and PNP transistors have low $h_{fe}$ because of their lateral structure. Also means to accommodate a compound transistor 101 comprising *m* number of individual transistors 301, 302 connected in a Darlington cascade configuration is shown. The $h_{fe}$ of the compound transistor 101 closely approximates the product of the $h_{fe}$'s of the individual transistors 301, 302. Presuming their individual $h_{fe}$'s, $h_{fe\ 301} = h_{fe\ 302}$ to be equal, a valid presumption over a range of currents, the $h_{fe}$ of the compound transistor 101 closely approximates $h^2_{fe\ 301}$.

it is well-known that the difference between the base-emitter potential offsets ($v_{be}$'s) of two transistor obeys the following relationship:

$$V_{be} = \frac{kT}{g} \ln \frac{i_2}{i_1} \qquad (1)$$

where:

$k$ is (boltzmam's)

T is absolute temperature, $q$ is charge on an electron, $i_2$ is the emitter current of the first transistor.

$i_1$ is the emitter current of the second transistor.

Unless the currents of the two transistors differ by orders of magnitude their respective $V_{be}$'s are approximately the same.

The forward-biased base-emitter junctions of transistors 310, 311, 312 cause the emitter electrode of transistor 310 to be offset in potential from the potential at node 315 by the sum of their individual offsets ($V_{BE}$'s). Similarly, the forward-biased base-emitter junctions of transistors 320, 321, 322 cause the emitter electrode of ransistor 320 to be offset in potential from the potential at node 315 by the sum of their individual offsets ($V_{be}$'s). Since the individual potential offsets of the transistors 310, 311, 312, 320, 321, 322 are approximately the same, the potentials at the emitter electrodes of transistors 310 and 320 are essentially offset from the potential at node 315 by the same amount and are, therefore, substantially equal. These equal potentials respectively impressed upon equal-resistance-value resistors 331, 332 cause the emitter currents of transistors 310, 320 to be the same.

The interconnection of the base and collector electrodes of transistors 311, 312, 320, 321, 322 causes them to function as semiconductor diodes. Since the diodes 320, 321, 322 are connected in series, their emitter currents are similar to each other and to that of transistor 310: consequently the $V_{be}$'s of the transistors 310, 320, 321, 322 are alike. The base current of transistor 310 is smaller than its emitter current, by its forward common emitter current gain, $h_{fe\ 310}$. The base current of transistor 310 is the emitter current of the diode-connected transistors 311, 312. Accordingly to satisfy equation 1 each of the transistors 311, 312 will have a smaller $V_{be}$ than that of the transistors 310 (and 320, 321, 322) by an amount:

$$\Delta V_{be\ 310-311} = \frac{kT}{q} \ln h_{fe\ 310}. \qquad (2)$$

PNP transistors 333 and 334 connected as an emitter-coupled differential amplifier have impressed between their base electrodes a voltage:

$$2\Delta V_{be\ 310-311} = 2\ \frac{kT}{q} \ln h_{fe\ 310} = \frac{kT}{q} \ln h^2_{fe\ 310}. \qquad (3)$$

The emitter electrodes of transistors 333, 334 being at the same potential, their $V_{be}$'s differ by an amount:

$$\Delta V_{be\ 334-333} = 2\Delta V_{be\ 310-311} = \frac{kT}{q} \ln h^2_{fe\ 310}. \qquad (4)$$

Referring back to equation 1, the ratio between the collector currents $I_1$, $I_2$ of transistors 333, 334 may be determined to be:

$$\frac{I_1}{I_2} = \frac{1}{h_{fe\ 310}{}^2} \qquad (5)$$

It follows that since $I_0 = I_1 + I_2$, $$I_1 = I_0\ \frac{1}{1 + h^2_{fe\ 310}} \quad \text{and}$$

$$I_2 = I_0\ \frac{h^2_{fe\ 310}}{1 + h^2_{fe\ 310}} \qquad (6a, b)$$

Applying $I_1$ as quiescent base current to the compound transistor 101, previously presumed to have an $h_{fe}$ of $h^2_{fe\ 301}$, will produce a quiescent collector current equal to $I_2$ if $h_{fe\ 301}$ equal $h_{fe\ 310}$. This can be done by arranging the quiescent currents of these transistors 301, 310 to be similar.

By Kirchoff's Current Law as applied to the node 105, the collector currents of the compound transistor 101 and of transistor 334 ($I_2$) provide equal input and output quiescent currents thereto. There is no quiescent current flow into node 105 through the load resistance 107 and the node 105 assumes the potential impressed on node 109, which potential is substantially unaffected by $h_{fe}$ variations of the compound transistor 101.

The potential between the joined emitter electrodes of transistors 333, 334 is 2 $V_{BE}$ removed from the potential on node 315, as may be calculated by considering $V_{BE}$ offsets contributed by the transistors 312, 311, 310, 333 and 322, 321, 320, 334. This potential difference impressed upon resistor 335 determines the current flow $I_0$ therethrough. $I_0$ may be made equal to $I_A$ by using Ohm's Law to determine suitable proportions between the resistance of resistors 331 and 332, the resistance of resistor 335, the 2 $V_{BE}$ potential thereacross and the potential provided by the source 119.

Since $I_2$ is the major portion of $I_0$ (per equation 6*b*) $I_2$ approximates $I_0 = I_A$ quite closely. The quiescent emitter current of the transistor 301 closely approximates its quiescent collector current, which is substantially the entire quiescent collector current of compound transistor 101 and equal to $I_2$. Therefore, the quiescent emitter current of compound transistor 101 is similar to $I_A$ and so $h_{fe\ 301}$ is similar to $h_{fe\ 310}$ if the transistors are similar.

In the FIG. 3 configuration $m$ was chosen to be two. However, $m$ may be chosen to be another positive integer. Generally speaking:

$$\frac{I_1}{I_2} = \frac{1}{h^m_{fe\ 310}} \qquad (7)$$

Figure 4:
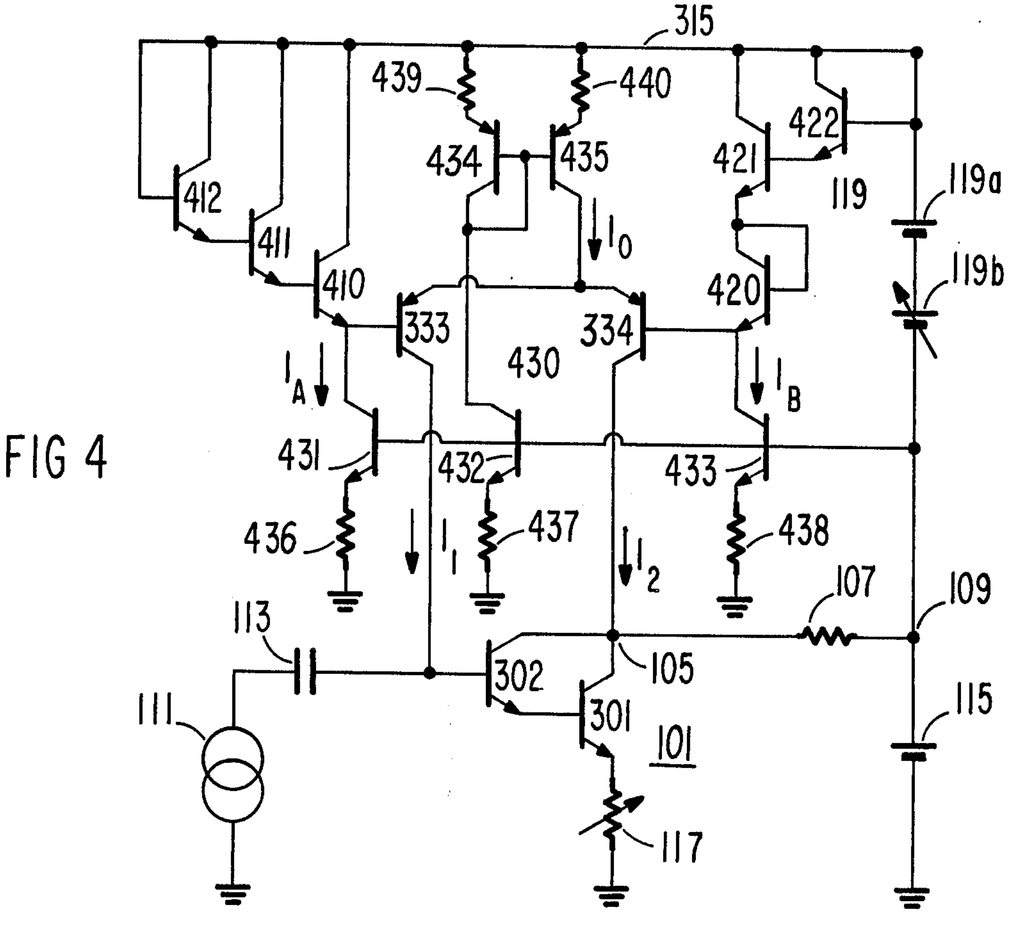
FIG. 4 illustrates an embodiment of the present invention suited for compound Darlington transistors wherein the component transistors have differing forward current gains because of differences in their current levels.

Referring to FIG. 4 an alternative configuration to that of FIG. 3 is shown for biasing a compound transistor 101 when the $h_{fe}$'s of its component transistors 301, 302 differ because of the emitter current level of transistor 301 being ($h_{fe\ 301}$ + 1) times that of transistor 302.

A means 430 of supplying equal currents $I_A$, $I_B$ and $I_O$ is shown employing similar NPN transistors 431, 432, 433; similar PNP transistors 434, 435; matched resistors 436, 437, 438 and matched resistors 439, 440. The equal emitter currents $I_A$ and $I_B$ of transistors 410, 420 cause their $V_{BE}$'s to be alike, and the emitter current $I_B$ also flows in transistor 421 causing its $V_{BE}$ to equal that of transistors 410 and 420. The transistors 410, 420, 421 will all have an $h_{fe}$ equal to that of transistor 410, $h_{fe\ 410}$. The emitter currents of transistors 411, 422 are smaller than those of the transistors 410, 420, 421 by a factor $h_{fe\ 410}$. The emitter current of transistor 412 will be smaller still by a factor $h_{fe\ 411}$, the $h_{fe}$ of transistor 411. The emitter current of transistor 412 is $h_{fe\ 410}$ $h_{fe\ 411}$ times smaller than that of transistors 410, 420, 421 so according to equation 1 its $V_{BE}$ is smaller than theirs by an amount:

$$\Delta V_{BE\ 412\ 410} = \frac{kT}{q} \ln h_{fe\ 410} h_{fe\ 411}. \qquad (8)$$

The base-emitter potentials offsets produced by the transistors 410, 420 are alike, and so are those produced by transistors 411, 422. The difference in $V_{BE}$ between transistors 412 and 421, identical to that between transistors 412 and 410, is applied to the base electrodes of the differential amplifier transistors 433, 434 to produce collector currents $I_2$ and $I_1$ which are in the ratio $h_{fe\ 410}$ $h_{fe\ 411}$ to one. Since $I_0 = I_1 + I_2$ this requires that:

$$I_1 = I_0\left(\frac{1}{1 + h_{fe\ 410} h_{fe\ 411}}\right) \quad \text{and}$$

$$I_2 = I_0\left(\frac{h_{fe\ 410} h_{fe\ 411}}{1 + h_{fe\ 410} h_{fe\ 411}}\right) \qquad (9a, b)$$

The current $I_1$ applied as quiescent base current to the compound transistor 101 produces a quiescent collector current:

$$I_{c\ 101} = \frac{h_{fe\ 301} h_{fe\ 302}}{1 + h_{fe\ 410} h_{fe\ 411}} \qquad (10)$$

The quiescent collector current $I_{c\ 101}$ will equal $I_2$ if $h_{fe\ 301}$ $h_{fe\ 302}$ equal $h_{fe\ 410}$ $h_{fe\ 411}$. This is the case, since the quiescent current levels in transistors 301 and 410 are similar as are the quiescent current levels of the transistors 302 and 411 supplying them base current.

By Kirchoff's Current Law there is no appreciable quiescent current flow through the load resistance 107 so the node 105 assumes the potential of node 109 and is substantially unaffected by $h_{fe}$ variations of the compound transistor 101.

While this specification and attendant claims adopt the lexicon of terms used to describe bipolar transistors, wherein the thermal stability problems solved by the present invention are more marked than in other types of transistor, the present invention is applicable to other types of transistor. The construction of the terms "base electrode", "emitter electrode" and "collector electrode" in the claims should be broad enough to encompass the input, common and output electrodes of such transistor types. The term transistor in the claims is to be construed broadly enought to include compound transistors of the Darlington type or of the type where an output transistor is preceded by common-collector transistor amplifiers.

What is claimed is:

1. Biasing arrangement for a first transistor having collector, emitter and base electrodes and being capable of providing collector current to base current gain, said biasing arrangement comprising:

a source of potentials including a reference potential;

a current supply with first and second terminals respectively providing first and second currents;

means included with said current supply and responsive to the absolute temperature of said first transistor for maintaining the ratio of said second current to said first current substantially equal to the ratio of said collector current to base current gain of said first transistor;

means to impress said first current on said base electrode of said first transistor;

means to impress said second current on said collector electrode of said first transistor;

means to couple said emitter electrode of said first transistor to said reference potential and collector load means coupling said collector electrode of said first transistor and said source of potentials.

2. Biasing arrangement as claimed in claim 1 including:

a second transistor included in said current supply, said second transistor having collector, emitter and base electrodes and being arranged to experience similar temperature variations as said first transistor;

biasing means to condition said second transistor for a collector current to base current gain, said biasing means supplying said collector current, an emitter current and said base current respectively to said collector, said emitter and said base electrodes of said second transistor;

means responsive to said second transistor base current to provide said first current proportional thereto; and means responsive to said second transistor emitter current to provide said second current, proportioned thereto.

3. Biasing arrangement as claimed in claim 2 wherein said current supply includes:

a current source linking the emitter electrode of said second transistor to the collector electrode of said first transistor and a current amplifier providing an output current equal in amplitude to its input current, direct current conductively coupled to accept said input current from the base electrode of said second transistor and to supply said output current to the base electrode of said first transistor.

4. Biasing arrangement as claimed in claim 1 wherein said current supply includes:

second and third transistors of a conduction type complementary to that of said first transistor, said second and said third transistors each having collector, emitter and base electrodes;

means connecting said second and said third transistors as an emitter-coupled differential amplifier to provide said first and said second currents from their respective said collector electrodes; and means to apply a potential proportional to said absolute temperature of said first transistor between the base electrodes of said second and said third transistors.

5. Biasing arrangement as claimed in claim 4 wherein said means to apply a potential proportional to said absolute temperature of said first transistor includes:

fourth, fifth, sixth and seventh transistors similar to said first transistor, each having collector and emitter and base electrodes, said emitter electrode of said fourth transistor being direct current conductively coupled to said base electrode of said fifth transistor, said base electrode of said fourth transistor being direct current conductively coupled to the same operating potential as said collector and said base electrodes of said sixth transistor, said emitter electrode of said sixth transistor being direct current conductively coupled to said collector and said base electrodes of said seventh transistor, said emitter electrodes of said fifth and said seventh transistor being direct current conductively coupled respectively to said base electrodes of said second and said third transistors, and a source of third and fourth equal-valued currents, said third current being applied between said emitter electrode of said fifth transistor and said collector electrodes of said fourth and said fifth transistors, said fourth current being applied between said emitter electrode of said seventh transistor and the joined said base and said collector electrodes of said sixth transistor.

6. Biasing arrangement adapted to provide first and second currents to semiconductor amplifier comprising:

first and second transistors each having a collector electrode, each having base and emitter electrodes with a base-emitter semiconductor junction therebetween, being connected with joined said emitter electrodes as an emitter-coupled differential amplifier and providing said first and said second currents from their respective said collector electrodes;

first and second pluralities of transistors each of $m + 1$ transistors, $m$ being a positive integer, each of said transistors having a collector electrode and having base and emitter electrodes with at least one base-emitter semiconductor junction therebetween, said base-emitter junctions of said first plurality of transistors connected in a first series combination, said base-emitter junctions of said second plurality of transistors connected in a second series combination, said base-emitter junctions within said first and said second series combinations being similarly poled between first and second ends of said first and said second combinations, said base electrode of each of said transistors in said first plurality thereof being connected to its said collector electrode except for a third transistor the emitter of which provides an end of said first series combination, said base electrode of each of said transistors in said second plurality thereof being connected to its said collector electrode, said first ends of said first and said second series combinations being connected respectively to base electrodes of said second and said first transistors;

an interconnection of said second ends of said first and said second series combinations; and first and second current supplies coupled respectively to said first ends of said first and said second series combinations to cause equal currents through said first ends and coupled to said interconnection and said collector electrode of said third transistor to complete loops for said equal currents.

7. Biasing arrangement as claimed in claim 6 having:

a third current supply providing quiescent currents to said joined emitter electrodes of said first and said second transistors, said quiescent current being equal to each of said equal currents in amplitude.

8. Biasing arrangement as claimed in claim 6 having combined therewith:

a third plurality of m transistors, each of said transistors having a collector electrode and having base and emitter electrodes with at least one base-emitter semiconductor junction therebetween, their base-emitter junctions being connected in a third series combination, the smaller of said first and said second currents being coupled to the base electrode at an end of said third series combination, the larger of said first and said second currents being coupled to the collector electrode of a fourth transistor included in said third plurality of transistors, the emitter electrode of which said fourth transistor is at an end of said third series combination; and means connected between the collector electrodes of each of the transistors in said third plurality and the emitter electrode of said fourth transistor for reverse biasing their collector electrodes with respect to their respective base electrodes.

9. Biasing arrangement for providing first and second currents comprising:

first, second, and third circuit nodes;

a source of a third current of a value substantially equal to the sum of the desired values of said first and said second currents;

first and second transistors of a first conductivity type having joined emitter electrodes connected to said source of third current, having respective base electrodes connected respectively to said first circuit node and to said second circuit node, having respective collector electrodes for respectively supplying said first current and said second current, and exhibiting a substantially logarithmic base-emitter potential versus collector current relationship;

a source of a fourth current connected to said first circuit node;

a source of a fifth current connected to said second circuit node;

a source of reference potential connected to said third circuit node;

an even-numbered plurality of transistors of a second conductivity type, each having base and emitter electrodes with a base-emitter junction therebetween and having a collector electrode coupled to said third node, said second conductivity type being complementary to said first conductivity type, each transistor in a first half of said even-numbered plurality of transistors having its base-emitter junction included in a path connecting said first node and said third node and poled to conduct at least a portion of said fourth current, each transistor in a second half of said even-numbered plurality of transistors having its base-emitter junction included in a path connecting said second node and said third node and poled to conduct at least a portion of said fifth current, whereby said first current is in ratio to said second current substantially as a power of a multiple of the ratio of said third current to said fourth current, said power being equal to half the number of transistors in said even-numbered plurality of transistors.

10. Biasing arrangement as set forth in claim 9 having in combination therewith:

a further transistor of said second conductivity type having a common-emitter forward current gain variation with temperature substantially equal to that of said auxiliary transistors and being in close thermal coupling therewith such that their temperatures are substantially equal, said further transistor being connected to said biasing arrangement to receive the smaller of said first and said second currents at its base electrode as its quiescent base current and to receive the larger of said first and said second currents at its collector electrode as its quiescent collector current.

11. In Combination:

a source of reference potential;

a first transistor amplifier having an input terminal and an output terminal and exhibiting a current gain therebetween;

a second transistor amplifier having an input terminal and an output terminal and exhibiting a current gain therebetween which is a predetermined and substantially fixed ratio times said first transistor amplifier current gain;

a resistive load coupled between said source of reference potential and the interconnected output terminals of said first and said second transistor amplifiers;

a current amplifier having an input circuit and an output circuit and exhibiting a current gain therebetween which is reciprocally related to said substantially fixed ratio;

means for applying a quiescent input current to the input terminal of said second transistor amplifier via the input circuit of said current amplifier, which quiescent input current is unresponsive to the quiescent output current of said first amplifier; and means for applying the quiescent current flowing in the output circuit of said current amplifier, responsive to said quiescent input current, to the input terminal of said first transistor amplifier, whereby the tendency of the quiescent output currents of said first and said second transistors to flow through said resistive load is reduced by at least an order of magnitude to cause said interconnected output terminals to be biased substantially at said reference potentials.

12. A circuit for biasing an amplifier transistor, said transistor having base, emitter and collector electrodes and exhibiting a base-to-collector current gain $G_1$, comprising, in combination:

reference signal establishing means;

means responsive to said reference signal and independent of, in the sense that it does not depend upon the output current of, said transistor for producing a quiescent bias current $I_1$ and applying that bias current, in the forward direction, to the base electrode of said transistor, whereby a given value of quiescent collector current $I_C = I_1G_1$ tends to flow in said transistor; and means responsive to said reference signal and independent of, in the sense that it does not respond to but rather supplies, the collector current of said transistor and responsive also to the temperature of said transistor, for supplying to the collector electrode of said transistor a current $I_2 = i_1G_2$, where $G_2$ is proportional to and varies with temperature in the same way as the gain $G_1$ of said transistor.

13. A circuit for biasing an amplifier transistor, said transistor having base and emitter and collector electrodes, and exhibiting a base-to-collector current gain $G_1$ and said amplifier having also a two terminal load, connected at one terminal to said collector electrode, said circuit comprising:

a reference signal establishing means;

means responsive to said reference signal and independent of, in the sense it does not depend upon the output current of said transistor for producing a quiescent bias current $I_1$ and applying that current in the forward direction, to the base electrode of said transistor, whereby a given value of quiescent collector current $I_C = I_1G_1$ tends to flow in said transistor, and said collector electrode is established at a given quiescent collector potential;

means for maintaining the other terminal of said load from that connected to said transistor collector electrode at a given potential to thereby establish a reference quiescent potential difference between said terminals; and means responsive to said reference signal and independent of, in the sense that it does not respond to the collector current of, said transistor and responsive also to any tendency of said bias current or the gain of said transistor to change for applying to the collector electrode of said transistor a current $I_1G_2$, where $G_2$ is proportional to and varies with temperature in the same way as the gain $G_1$ of said transistor and in a sense to maintain said collector electrode at substantially said given quiescent collector potential in spite of variation in said bias current or variation in transistor gain caused by temperature change.

* * * * *